United States Patent
Isaacs (10) Patent No.: US 9,426,900 B2
(45) Date of Patent: Aug. 23, 2016

(54) SOLDER VOID REDUCTION FOR COMPONENT ATTACHMENT TO PRINTED CIRCUIT BOARDS

(71) Applicant: GLOBALFOUNDRIES Inc., Grand Cayman (KY)

(72) Inventor: Phillip D. Isaacs, Rochester, MN (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 260 days.

(21) Appl. No.: 14/078,777

(22) Filed: Nov. 13, 2013

(65) Prior Publication Data

US 2015/0131250 A1 May 14, 2015

(51) Int. Cl.
*H05K 1/02* (2006.01)
*H05K 3/34* (2006.01)

(52) U.S. Cl.
CPC ............ *H05K 3/3436* (2013.01); *H05K 1/0209* (2013.01); *H05K 1/0206* (2013.01); *H05K 2201/09063* (2013.01); *H05K 2201/09781* (2013.01); *H05K 2203/0207* (2013.01); *H05K 2203/1178* (2013.01); *Y02P 70/613* (2015.11); *Y10T 29/49144* (2015.01); *Y10T 29/49165* (2015.01)

(58) Field of Classification Search
CPC ..... H05K 3/40; H05K 3/4007; H05K 3/4038; H05K 3/42; H05K 3/429; H05K 1/0206; H05K 1/0209; H05K 3/3436; H05K 2201/09063; H05K 2201/09781; H05K 2203/0207; H05K 2203/1178; Y02P 70/813; Y10T 29/49144; Y10T 29/49165
See application file for complete search history.

(56) References Cited

U.S. PATENT DOCUMENTS

| | | | |
|---|---|---|---|
| 4,628,409 A | 12/1986 | Thompson et al. | |
| 5,571,593 A | 11/1996 | Arldt et al. | |
| 5,592,025 A | 1/1997 | Clark et al. | |
| 5,743,004 A | 4/1998 | Chobot et al. | |
| 5,956,843 A * | 9/1999 | Mizumoto | H05K 1/113 174/257 |
| 6,326,559 B1 * | 12/2001 | Yoshioka | H05K 3/0035 174/255 |
| 6,717,070 B2 * | 4/2004 | Watanabe | H05K 3/421 174/258 |
| 6,803,528 B1 * | 10/2004 | Koyanagi | H05K 3/421 174/256 |
| 6,832,436 B2 | 12/2004 | Anstrom et al. | |
| 7,834,273 B2 * | 11/2010 | Takahashi | H05K 1/115 257/774 |

(Continued)

FOREIGN PATENT DOCUMENTS

JP 2013110332 6/2013

*Primary Examiner* — Carl Arbes
(74) *Attorney, Agent, or Firm* — Robert Curcio; DeLio, Peterson & Curcio, LLC (57) ABSTRACT

A method includes fabricating a printed circuit board. The fabricating includes forming at least one conductive layer on top a first dielectric layer. The fabricating includes forming a second dielectric layer on top of the at least one conductive layer. The fabricating includes forming a thermal pad on top of the second dielectric layer. The fabricating includes forming a first through hole through the thermal pad, the second dielectric layer, the at least one conductive layer, and the first dielectric layer. The fabricating includes filling the first through hole with a conductive material to form a plated through hole. The fabricating includes topdrilling the plated through hole to remove a top portion of the conductive material from a top of the plated through hole, wherein a bottom portion of the conductive material remains in the plated through hole after removal of the top portion.

14 Claims, 8 Drawing Sheets

(56) References Cited

U.S. PATENT DOCUMENTS

| | | | |
|---|---|---|---|
| 7,838,779 B2 * | 11/2010 | Yamamichi | H01L 21/486 174/260 |
| 7,985,930 B2 * | 7/2011 | Asai | H05K 3/387 174/255 |
| 8,030,768 B2 | 10/2011 | Robles et al. | |
| 8,242,379 B2 * | 8/2012 | Ikeda | H01L 21/4857 174/261 |
| 2013/0098671 A1 | 4/2013 | Thurairajaratnam et al. | |

* cited by examiner

SOLDER VOID REDUCTION FOR COMPONENT ATTACHMENT TO PRINTED CIRCUIT BOARDS

BACKGROUND

Embodiments of the inventive subject matter generally relate to the field of printed circuit board fabrication and, more particularly, to solder void reduction of solder between thermal pads on printed circuit boards and electronic packages attached thereto.

Printed Circuit Boards (PCB) are used to electrically connect different electrical components together. The electrical components can include different types of electronic packages (e.g., Quad Flat No-lead (QFN) packages), resistors, capacitors, etc. The PCBs are typically configured to include thermal or conductive pads (e.g., a copper pads). An electronic package can be physically and electrically connected to the PCB on top of a thermal pad using solder. In addition to providing electrical connectivity for the electronic package to the PCB, these thermal pads typically serve as a heatsink. Acting as a heatsink, the thermal pad can provide a thermal dissipation pathway from the electronic package to conductive layers in the PCB. Conventional approaches for PCBs include Plated Through Holes (PTHs) in the thermal pads that are used for both electrical connectivity and thermal dissipation. However, these PTHs can be problematic when the electronic packages are being soldered to the thermal pads. Specifically, during the soldering process, these PTHs can thieve solder from the solder joint, thereby leaving large solder voids between the electronic package and the thermal pad. Voids can also be formed in the solder because of the volatility of the flux solvents in which the PTHs allow for venting of the outgassing from the heated solvents.

SUMMARY

In some embodiments, a method includes fabricating a printed circuit board. The fabricating includes forming at least one conductive layer on top a first dielectric layer. The fabricating includes forming a second dielectric layer on top of the at least one conductive layer. The fabricating includes forming a thermal pad on top of the second dielectric layer, wherein an electronic package is to be soldered on top of the thermal pad. The fabricating includes forming a first through hole through the thermal pad, the second dielectric layer, the at least one conductive layer, and the first dielectric layer. The fabricating includes filling the first through hole with a conductive material to form a plated through hole for electrically coupling the thermal pad to the at least one conductive layer. The fabricating includes topdrilling the plated through hole to remove a top portion of the conductive material from a top of the plated through hole, wherein a bottom portion of the conductive material remains in the plated through hole after removal of the top portion.

In some embodiments, a method includes fabricating a printed circuit board. The fabricating includes forming a first conductive layer on top a first dielectric layer. The fabricating includes forming a second dielectric layer on top of the at least one first conductive layer. The fabricating includes forming a second conductive layer on top of the second dielectric layer. The fabricating includes forming a third dielectric layer on top of the second conductive layer. The fabricating includes forming a thermal pad on top of the third dielectric layer, wherein an electronic package is to be soldered on top of the thermal pad. The fabricating includes forming a first through hole through the thermal pad, the third dielectric layer, the second conductive layer, the second dielectric layer, the first conductive layer, and the first dielectric layer. The fabricating includes filling the first through hole with a conductive material to form a plated through hole. The fabricating includes topdrilling the plated through hole to remove a top portion of the conductive material from a top of the plated through hole, wherein a bottom portion of the conductive material remains in the plated through hole after removal of the top portion.

In some embodiments, an apparatus includes a printed circuit board. The printed circuit board includes a first dielectric layer and at least one conductive layer formed on top of the first dielectric layer. The printed circuit board includes a second dielectric layer formed on top of the at least one conductive layer and a thermal pad formed on top of the second dielectric layer, wherein an electrical package is to be soldered on top of the thermal pad. The printed circuit board includes a partially plated through hole filled partially with conductive material, wherein the partially plated through hole extends through the thermal pad, the second dielectric layer, the at least one conductive layer, and the first dielectric layer. A portion of the conductive material has been removed using a topdrill operation, wherein a top portion of the conductive material is removed from a top of the partially plated through hole and a bottom portion of the conductive material below the top portion remains in the partially plated through hole.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences and computer program products that embody techniques of the present inventive subject matter. However, it is understood that the described embodiments may be practiced without these specific details. For instance, although examples refer to Printed Circuit Boards, various embodiments can used in the fabrication of other types of boards or cards used for attaching various electrical components for electrically coupling the electrical components. In other instances, well-known structures and techniques have not been shown in detail in order not to obfuscate the description.

Various embodiments include PCB fabrication that reduce solder voids for the solder between thermal pads of the PCB and electronic packages that are to be attached on top of the thermal pads. In some embodiments, one or more at least partially unplated through holes are formed in thermal pads on the PCB. The at least partially unplated through holes can extend through the PCB. In some embodiments, to create the at least partially plated through holes, prior to soldering electronic packages on top of the thermals pads, one or more of the plated through holes are topdrilled (from the top of the PCB) partially to remove the conductive material (e.g., copper) therein. As a result, when the solder is applied to the thermal pads for attaching the electronic packages, the solder will not wet in the plated through holes because of the absence of the conductive material at the top portion of the plated through hole. Also, the at least partially unplated through holes provide vents for the solder to be added on top of the thermal pads. As a result, the at least partially unplated through holes can allow hot gas and vapors from the reflow process to escape the solder joint, thereby allowing for a uniform solder joint and thermal interface contact area.

In some embodiments, the PCBs can also include unplated through holes that extend down through the thermal pads. The unplated through holes can extend through the PCB. The unplated through holes can also provide vents for the solder to be added on top of the thermal pads. As a result, the unplated through holes can allow hot gas and vapors from the reflow process to escape the solder joint, thereby allowing for a uniform solder joint and thermal interface contact area. Also, when the solder is applied to the thermal pads for attaching electronic packages, there is no conductive material in the unplated through holes to thieve away solder from the solder joint. Accordingly, some embodiments can include fabricated PCBs that include different combinations of both partially unplated holes (topdrilled) and unplated through holes.

Accordingly, various embodiments can cause less solder to be thieved by the partially unplated through holes (topdrilled) and/or the unplated through holes during the solder process in comparison to conventional approaches. Specifically, no conductive material in the unplated through holes and less conductive material in the plated through holes will thieve less solder. Because less solder is thieved during the soldering process, various embodiments provide a better thermal interface formed by the solder joint between the electronic package and the PCB.

Figure 1:
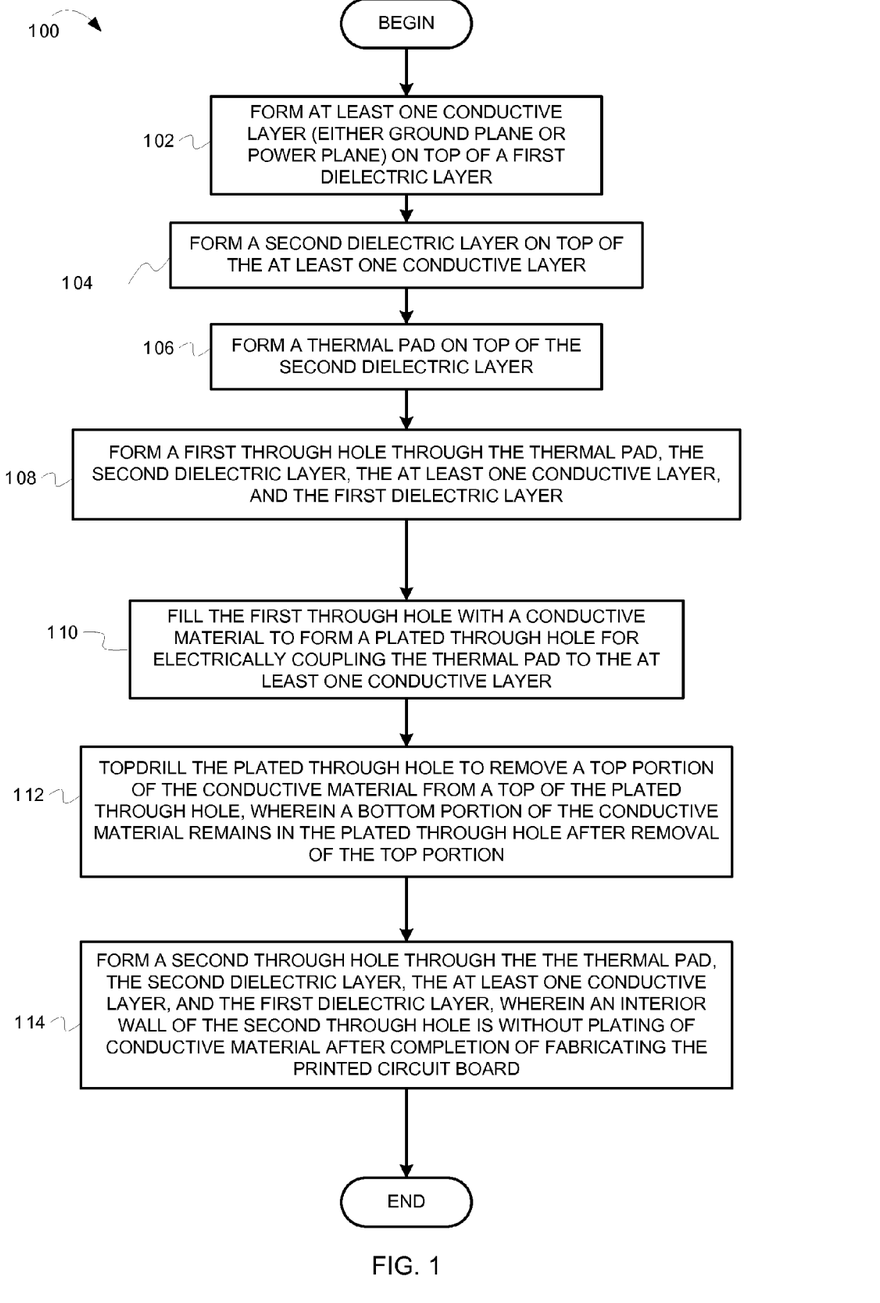
FIG. 1 depicts a flowchart of operations for PCB fabrication to provide reduced solder void reduction for the solder between an electronic package and a thermal pad of the PCB, according to some embodiments.

FIG. 1 depicts a flowchart of operations for PCB fabrication to provide reduced solder void for the solder between an electronic package and a thermal pad of the PCB, according to some embodiments. FIG. 1 is described in reference to FIGS. 2-9 which depict PCBs at various stages of PCB fabrication. FIGS. 1-9 depict fabrication of one thermal pad for attaching one electronic package. However, embodiments can include fabrication of multiple thermal pads for attaching multiple electronic packages. Operations of a flowchart 100 begin at block 102.

Figure 2:
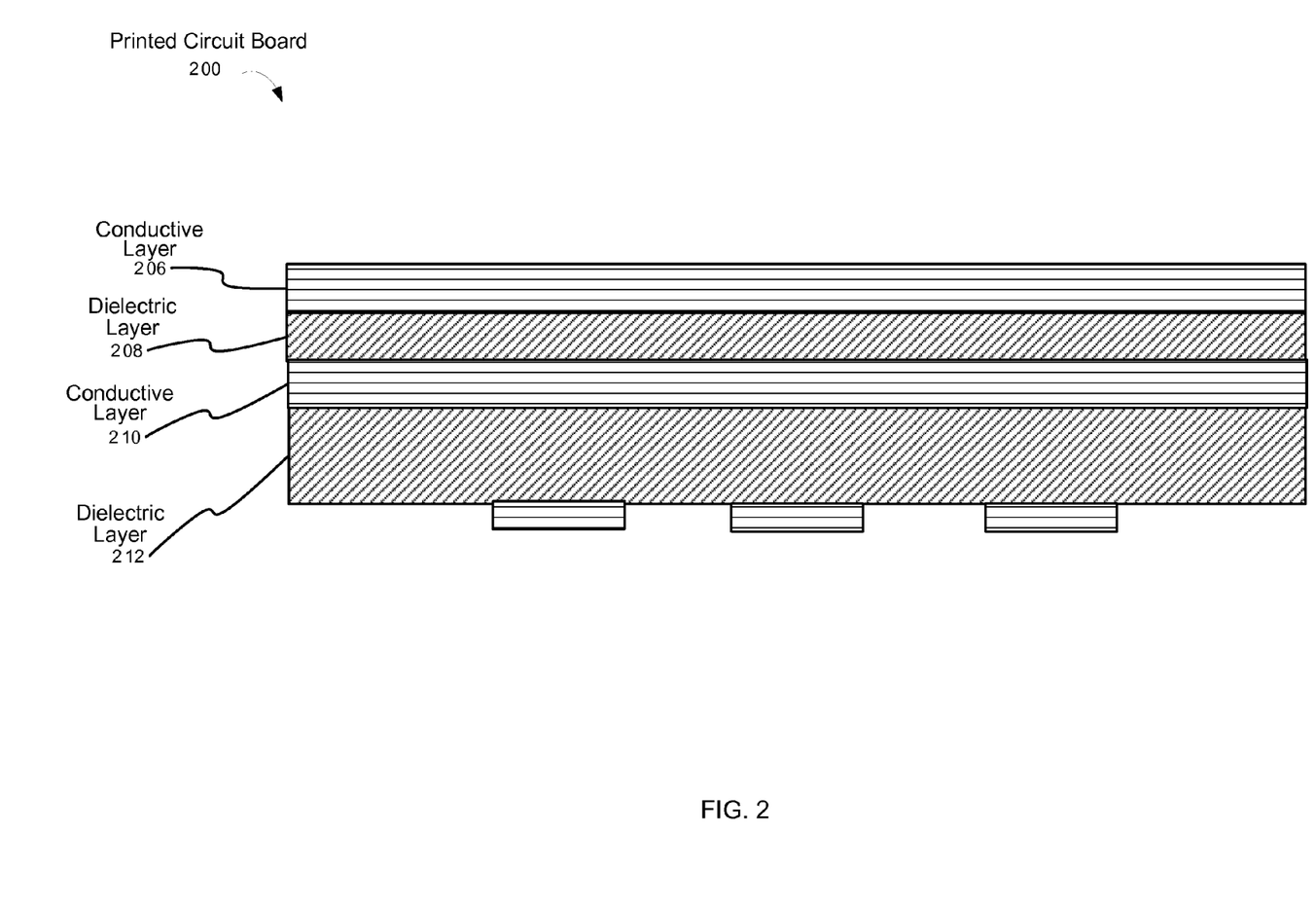
FIG. 2 depicts a cutaway side view of a PCB during a first stage of fabrication, according to some embodiments.

At block 102, at least one conductive layer is formed on top of at least one dielectric layer. To help illustrate, FIG. 2 depicts a cutaway side view of a PCB during a first stage of fabrication, according to some embodiments. In this example, the current stage of fabrication of a PCB 200 is such that two dielectric layers and two conductive layers have been formed. On the PCB 200, a conductive layer 210 is formed on top of a dielectric layer 212. A dielectric layer 208 is formed on top of the conductive layer 210. A conductive layer 206 is then formed on top of the dielectric layer 208. In some embodiments, the conductive layer 206 and the conductive layer 210 can serve multiple purposes the electrical components and electronic packages attached to the PCB 200 are operational. First, the conductive layer 206 and the conductive layer 210 can be part of the thermal dissipation of heat generated by the electronic packages attached to the PCB 200 (as further described below). Also, the conductive layer 206 and the conductive layer 210 can be at least one of a ground plane and a power plane. Specifically, the conductive layer 206 and the conductive layer 208 can serve as a grounding or providing power to the electronic packages attached to the PCB 200. For example, the conductive layer 206 can be a power plane, and the conductive layer 210 can be a ground plane. In another example, the conductive layer 206 and the conductive layer 210 can both be power planes or ground planes. In this example, the PCB 200 only includes two conductive layers. However, the PCB 200 can have any number of conductive layers interleaved with dielectric layers as shown. In some embodiments, the conductive layer 206 and the conductive layer 210 are not used for transmitting signals during operation of the electronic package. Operations of the flowchart 100 continue at block 104.

Figure 3:
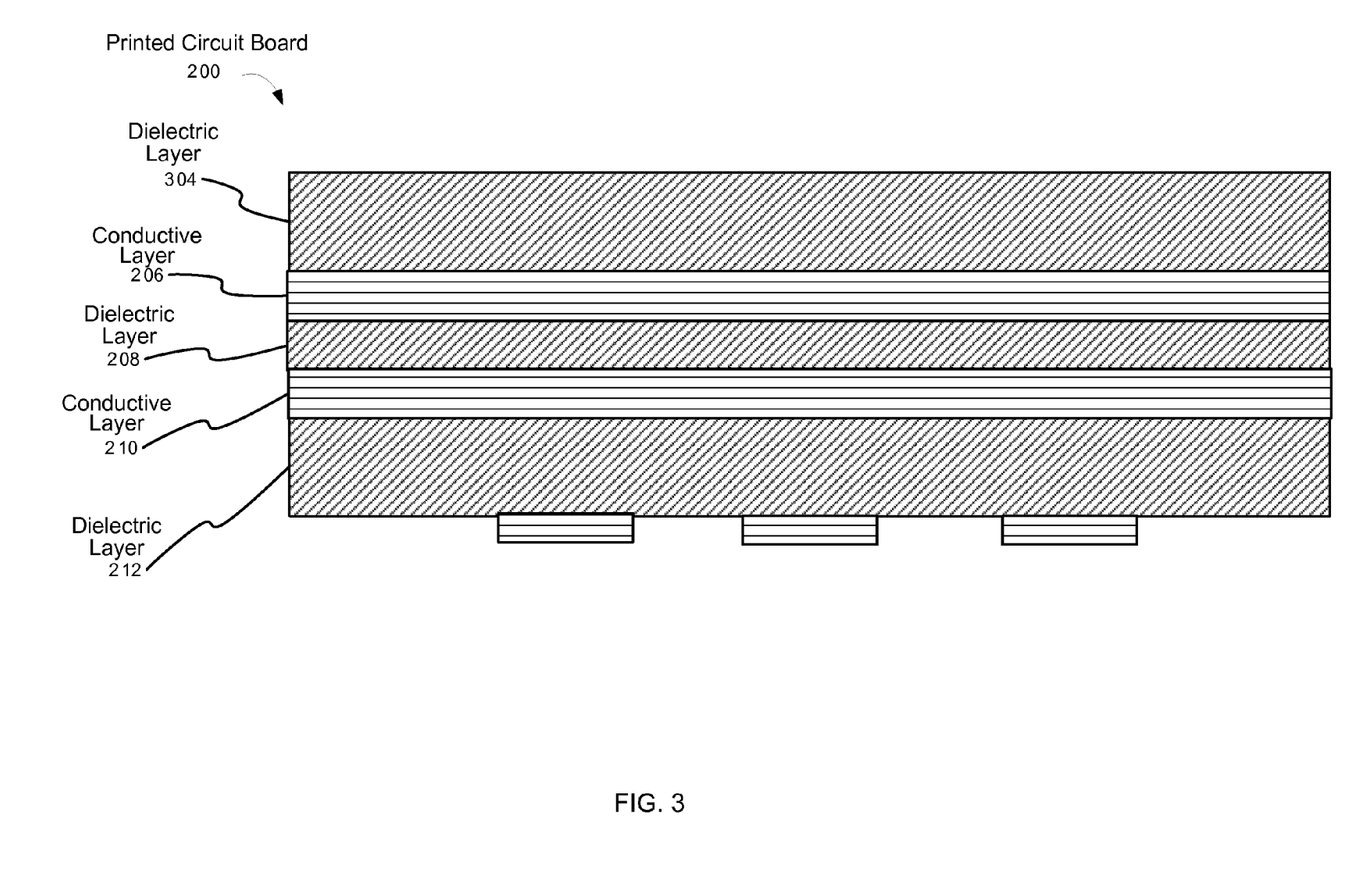
FIG. 3 depicts a cutaway side view of a PCB during a second stage of fabrication, according to some embodiments.

At block 104, a second dielectric layer is formed on top of the at least one conductive layer. To help illustrate, FIG. 3 depicts a cutaway side view of a PCB during a second stage of fabrication, according to some embodiments. In particular, FIG. 3 depicts the PCB 200 at a next stage of fabrication after the stage depicted in FIG. 2. On the PCB 200, a dielectric layer 304 is formed on top of the conductive layer 206. Operations of the flowchart 100 continue at block 106.

Figure 4:
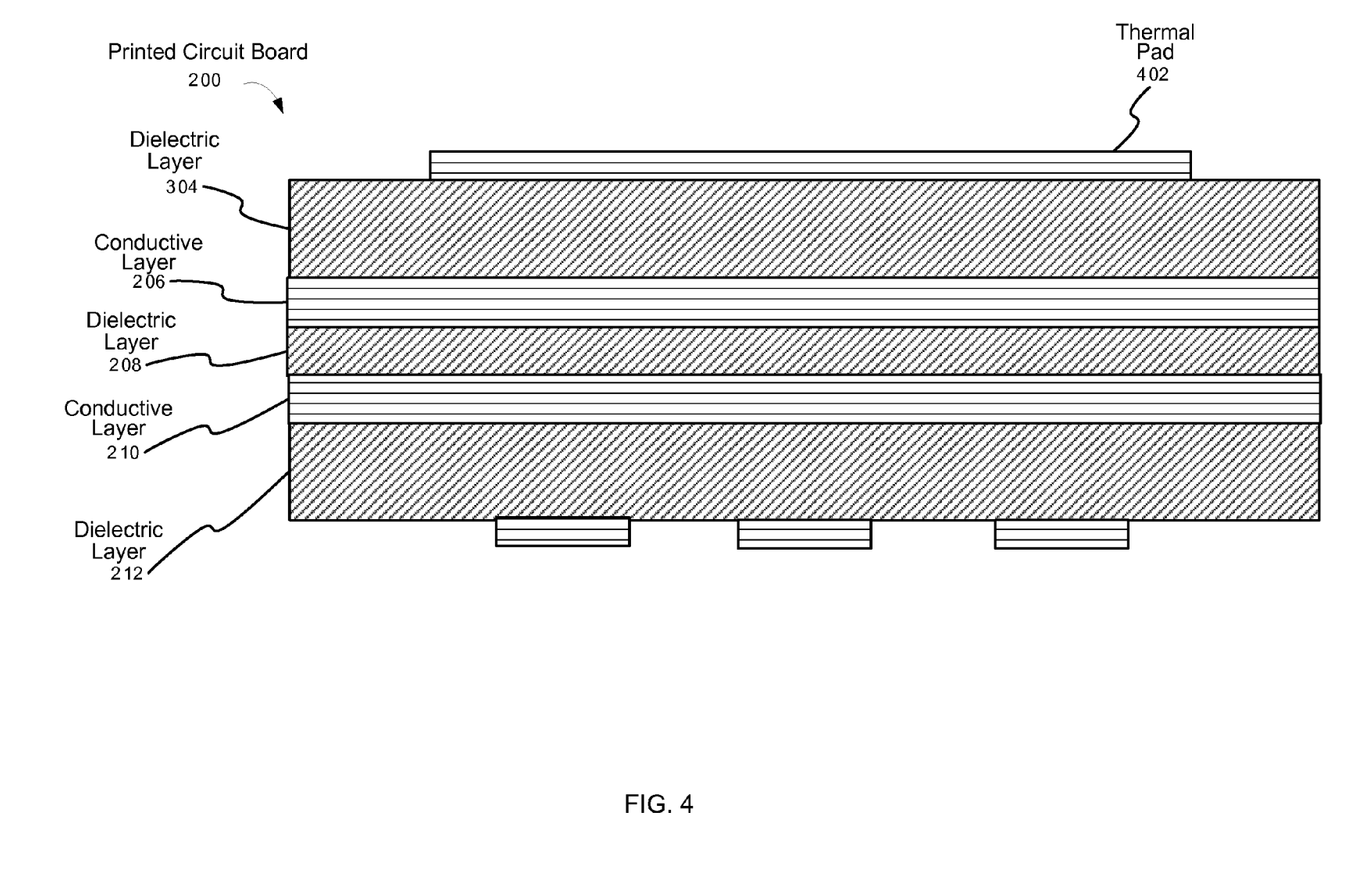
FIG. 4 depicts a cutaway side view of a PCB during a third stage of fabrication, according to some embodiments.

At block 106, a thermal pad is formed on top of the second dielectric layer. To help illustrate, FIG. 4 depicts a cutaway side view of a PCB during a third stage of fabrication, according to some embodiments. In particular, FIG. 4 depicts the PCB 200 at a next stage of fabrication after the stage depicted in FIG. 3. On the PCB 200, a thermal pad 402 is formed on top of the dielectric layer 304. As further described below, the thermal pad 402 can be a location on the PCB 200 where an electronic package can be soldered. In addition to providing electrically connectivity for the electronic package to the PCB 200, the thermal pad 402 can serve as a heatsink. Acting as a heatsink, the thermal pad 402 can provide a thermal dissipation pathway from the electronic package to the PCB 200. Operations of the flowchart 100 continue at block 108.

Figure 5:
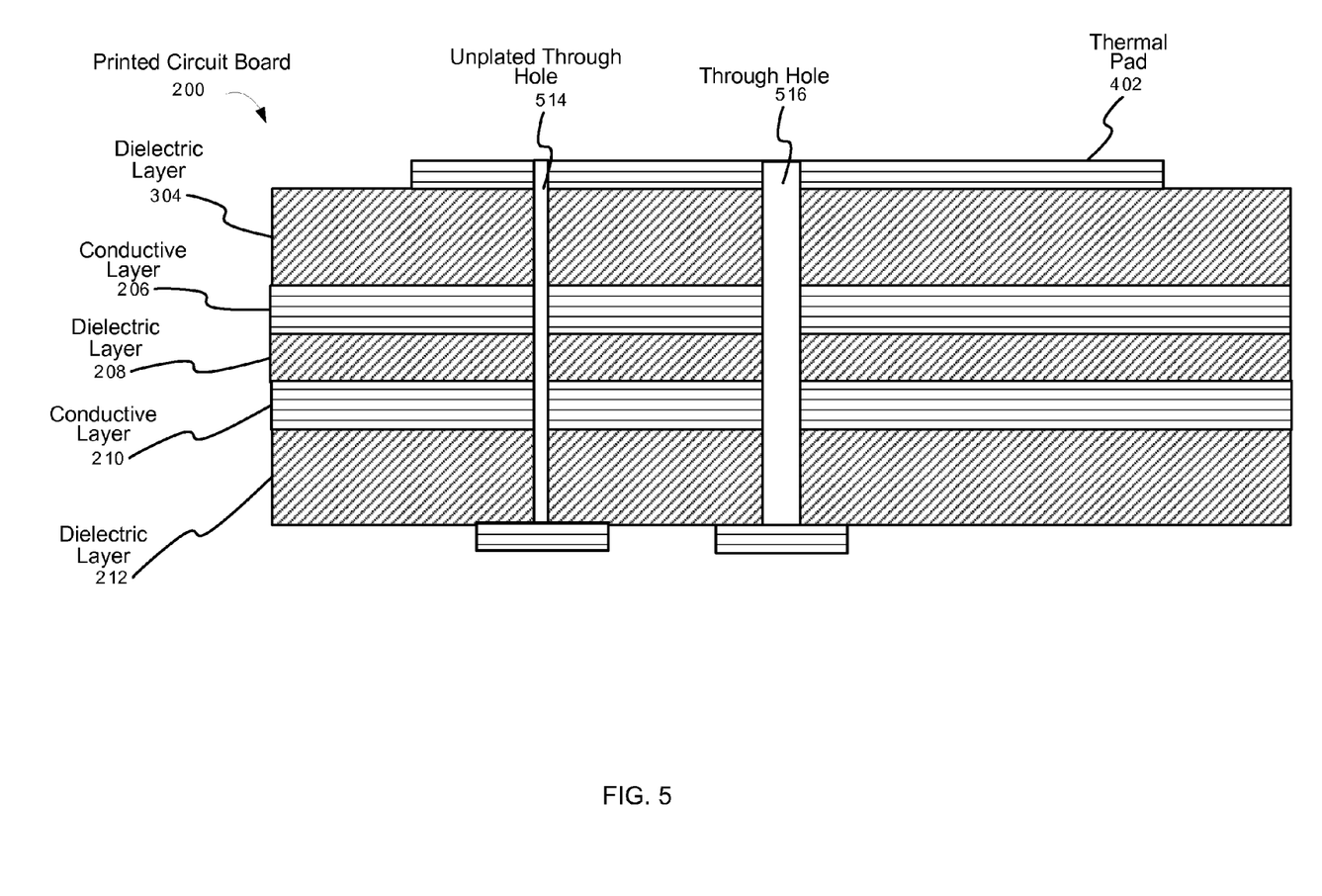
FIG. 5 depicts a cutaway side view of a PCB during a fourth stage of fabrication, according to some embodiments.

At block 108, a first through hole is formed that extends through the thermal pad, the second dielectric layer, the at least one conductive layer, and the first dielectric layer. To help illustrate, FIG. 5 depicts a cutaway side view of a PCB during a fourth stage of fabrication, according to some embodiments. In particular, FIG. 5 depicts the PCB 200 at a next stage of fabrication after the stage depicted in FIG. 4. On the PCB 200, a through hole 516 is formed through the thermal pad 402, the dielectric layer 304, the conductive layer 206, the dielectric layer 208, the conductive layer 210, and the dielectric layer 212. In this example, the PCB 200 includes two through holes. However, embodiments can include any number of through holes. An unplated through hole 514 is also formed in the PCB 200. Formation of the unplated through hole 514 is further described below. Operations of the flowchart 1000 continue at block 110.

Figure 6:
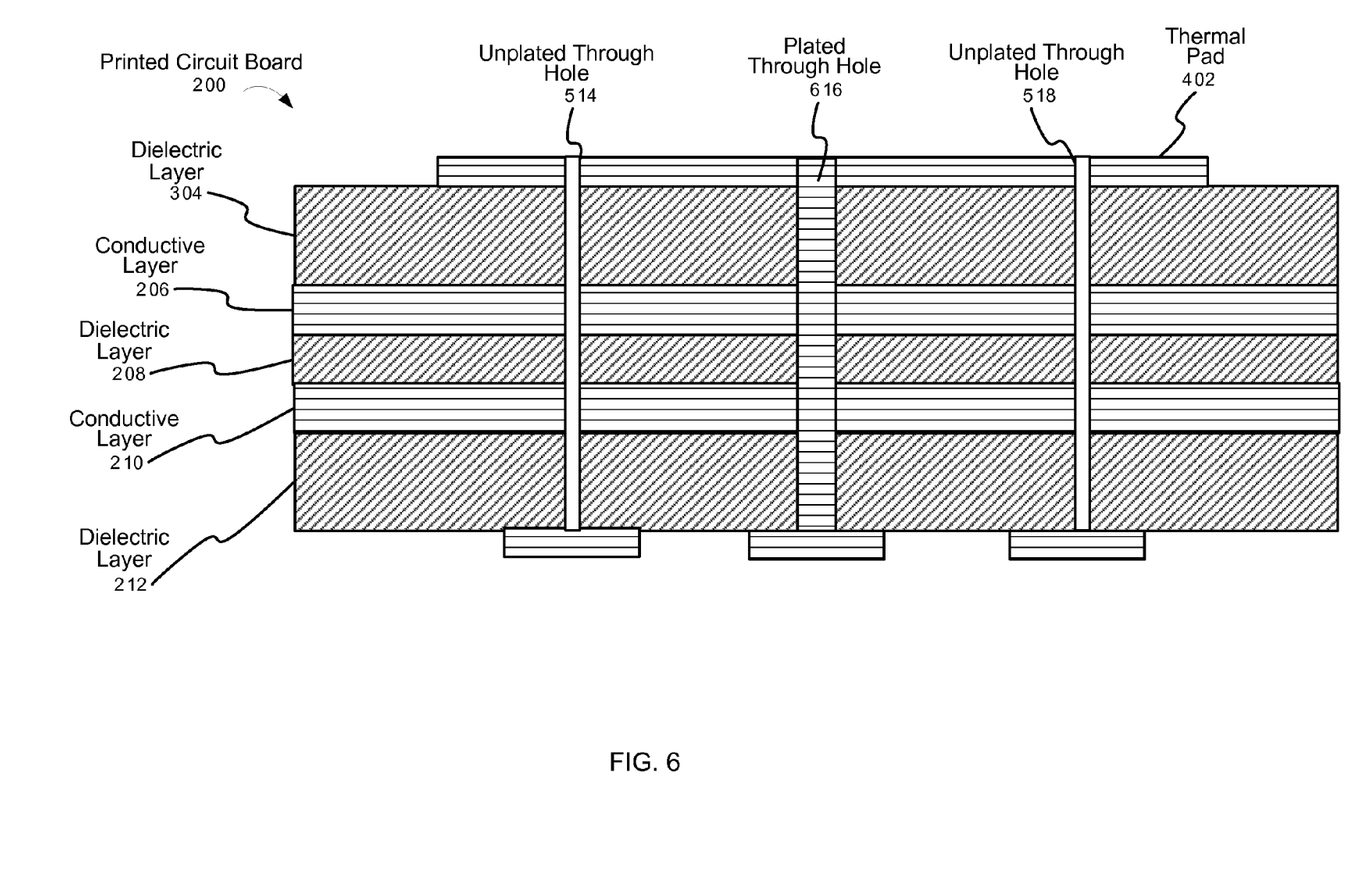
FIG. 6 depicts a cutaway side view of a PCB during a fifth stage of fabrication, according to some embodiments.

At block 110, the first through hole is filled with conductive material to form a plated through hole for electrically coupling the thermal pad to the at least one conductive layer. To help illustrate, FIG. 6 depicts a cutaway side view of a PCB during a fifth stage of fabrication, according to some embodiments. In particular, FIG. 6 depicts the PCB 200 at a next stage of fabrication after the stage depicted in FIG. 5. On the PCB 200, a plated through hole 614 is formed after the through hole 516 is filled with conductive material. In some embodiments, the conductive material can be copper. Operations of the flowchart 100 continue at block 112.

Figure 7:
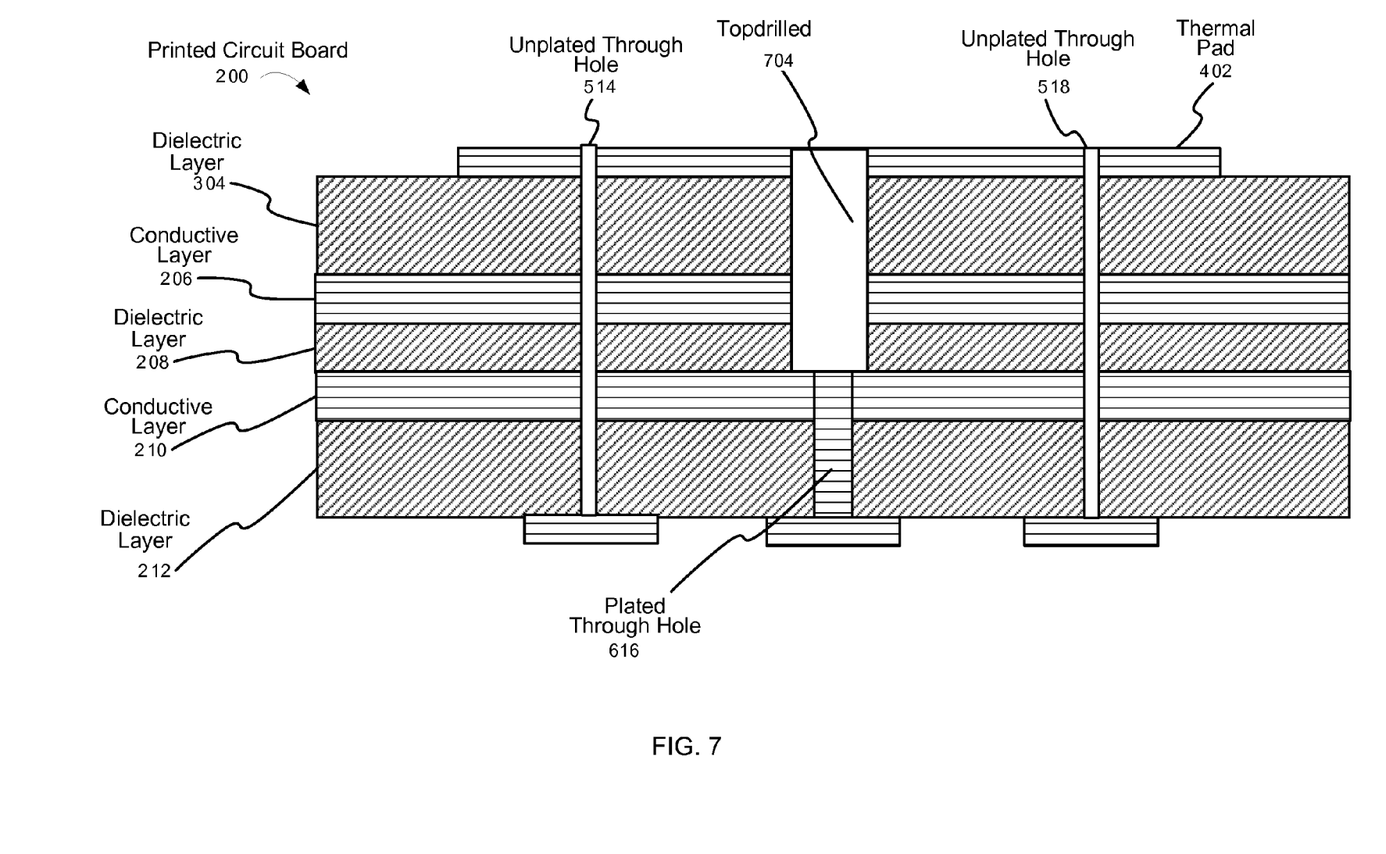
FIG. 7 depicts a cutaway side view of a PCB during a sixth stage of fabrication, according to some embodiments.

At block 112, the plated through hole is topdrilled to remove a top portion of the conductive material from the top of the plated through hole, wherein a bottom portion of the conductive material remains in the plated through hole after removal of the top portion. To help illustrate, FIG. 7 depicts a cutaway side view of a PCB during a sixth stage of fabrication, according to some embodiments. In particular, FIG. 7 depicts the PCB 200 at a next stage of fabrication after the stage depicted in FIG. 6. In this example, the plated through hole 616 has been partially topdrilled (shown as topdrilled 704). The topdrilling is from the top of the PCB 200. The topdrilling removes the conductive material from the plated through hole 616 up to the point where topdrilling occurs. In this example, the topdrilling removes the conductive material from the plated through hole 616 down to the conductive layer 210. As a result, when the solder is applied to the thermal pads for attaching the electronic packages, the solder will not wet in the plated through holes because of the absence of the conductive material at the top portion of the plated through hole. Operations of the flowchart 100 continue at block 114.

At block 114, a second through hole is formed that extends through the thermal pad, the second dielectric layer, the at least one conductive layer, and the first dielectric layer. An interior wall of the second through hole is without a plating of conductive material for coupling the thermal pad to the at least one conductive layer. Returning to FIG. 5 to help illustrate, on the PCB 200, the unplated through hole 514 is formed through the thermal pad 402, the dielectric layer 304, the conductive layer 206, the dielectric layer 208, the conductive layer 210, and the dielectric layer 212. The unplated through hole 514 remain unplated (without conductive material). In some embodiments, the diameter of unplated through holes can be on the order of 0.25 millimeters. Sizes of the unplated through holes can be small relative to a size of the surface area of the solder joint on top of the thermal pad. For example, the unplated through holes can be formed in less than a defined percentage (e.g., 1%, 5%, etc.) of the surface area of the thermal pad.

In this example, there is one unplated through hole and one partially plated through hole (topdrilled). However, there can be multiple unplated through holes and multiple partially plated through holes (topdrilled). Also, the amount that a plated through hole is topdrilled can be configurable. For example, a given plated through hole can be topdrilled at any percentage between 1% and 99% (e.g., 25%, 50%, 75%, etc.). In some embodiments, different plated through holes in the PCB can be topdrilled different amounts. For example, the plated through holes closer to the center of the thermal pad can be topdrilled more than the plated through holes closer to the edges of the thermal pad. In some embodiments, the amount that a plated through hole is topdrilled can be proportional to the number of partially plated through holes and/or the number of unplated through holes in the PCB. For example, the amount of topdrilling of the plated through holes increases as the number of partially plated through holes increases. In some embodiments, the number of partially plated through holes can be based on the size of the surface area of the electronic package that is to be soldered to the thermal pad. For example, the greater the size of the surface area of the electronic package to be soldered the more number of partially plated through holes. In some embodiments, the amount that the partially plated through holes are topdrilled can also be based on the size of the surface area of the electronic package that is to be soldered to the thermal pad. For example, the greater the size of the surface area of the electronic package to be soldered the greater the percentage of the partially plated through holes that is topdrilled.

In some embodiments, the diameter of the unplated through holes (e.g., the through hole) is less than the diameter of the partially plated through holes (e.g., the plated through hole 616). The diameter of the unplated through holes can vary among each other. Also, the diameter of the unplated through holes can vary based on a size of the thermal pad 402 and/or the number of unplated through holes. In some embodiments, the characteristics of the unplated through holes can vary in relation to the characteristics of the partially plated through holes. For example, the number of unplated through holes can be less as the number of partially plated through holes increase. In another example, the diameter of the unplated through holes can decrease as the number of partially plated through holes increase or diameters of the partially plated through holes increase. In another example, the number of through holes can vary based on the number of plated through holes that have been topdrilled and an amount of topdrilling. Also, the diameter of through holes can vary based on the number of plated through holes that have been topdrilled and an amount of topdrilling. Also, while illustrated such that a PCB has both unplated through holes and partially plated through holes, in some embodiments, the PCB can be configured to have either unplated through holes and partially plated through holes. Operations of the flowchart 100 are complete.

As described, various embodiments include PCB fabrication that reduce solder voids for the solder between thermal pads of the PCB and electronic packages that are to be attached on top of the thermal pads. To help illustrate, FIGS. 8-9 depict cutaway side views of a portion of a PCB having an electronic package soldered to a thermal pad.

Figure 8:
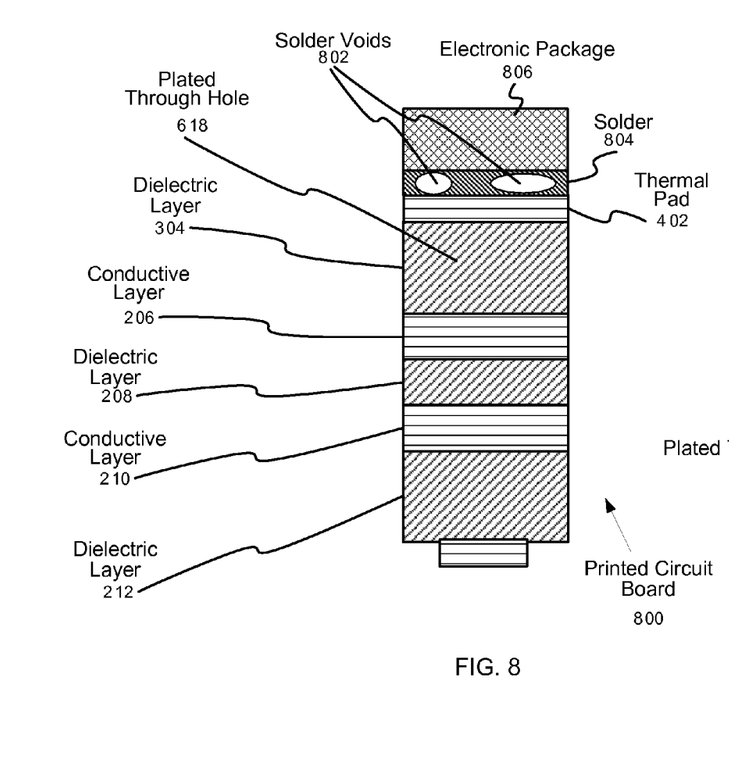
FIG. 8 depicts a cutaway side view of a portion of a PCB having an electronic package soldered to a thermal pad without reduced solder voids.

FIG. 8 depicts a cutaway side view of a portion of a PCB having an electronic package soldered to a thermal pad without reduced solder voids. FIG. 8 depicts a PCB 800 with the example layers depicted in FIGS. 2-7 (described above)—the thermal pad 402 on top of the dielectric layer 304 on top of the conductive layer 206 on top of the dielectric layer 208 on top of the conductive layer 210 on top of the dielectric layer 212. An electronic package 806 is soldered on top of the thermal pad 402 with a solder 804. During the soldering process, large solder voids 802 are formed, in part, because hot gas and vapors from the reflow process are not allowed to escape the solder joint.

Figure 9:
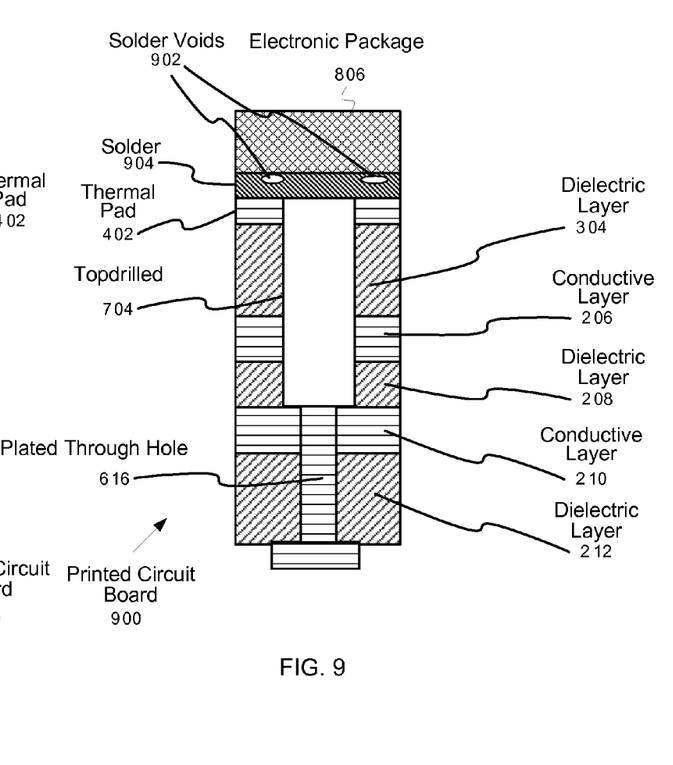
FIG. 9 depicts a cutaway side view of a portion of a PCB having an electronic package soldered to a thermal pad with reduced solder voids, according to some embodiments.

In contrast, FIG. 9 depicts a cutaway side view of a portion of a PCB having an electronic package soldered to a thermal pad with reduced solder voids, according to some embodiments. FIG. 9 depicts a PCB 900 with the example layers depicted in FIGS. 2-7 (described above)—the thermal pad 402 on top of the dielectric layer 304 on top of the conductive layer 206 on top of the dielectric layer 208 on top of the conductive layer 210 on top of the dielectric layer 212. The PCB 900 also includes the plated through hole 616 that has been partially topdrilled (shown as topdrilled 704). The electronic package 806 is soldered on top of the thermal pad 402 with a solder 904.

During the soldering process, smaller solder voids 902 (in comparison to the solder voids 802 depicted in FIG. 8) are formed because of the partially plated through hole 616. Specifically, during the soldering process, the partially plated through holes (and the unplated through holes) can allow hot gas and vapors from the reflow process to escape the solder joint, thereby allowing for a uniform solder joint and thermal interface contact area. Also, when the solder is applied to the thermal pads for attaching electronic packages, there is no conductive material at the top of the partially plated through holes and no conductive material in the unplated through holes to thieve away solder from the solder joint. In the example of FIG. 9, the PCB 900 only includes a partially plated through hole. However, the PCB 900 can include multiple partially plated through holes and multiple unplated through holes. As shown, the solder voids in the solder between the electronic package 806 and the thermal pad 402 are less when the PCB includes an unplated through hole through the thermal pad 402.

While the embodiments are described with reference to various implementations and exploitations, it will be understood that these embodiments are illustrative and that the scope of the inventive subject matter is not limited to them. In general, techniques for PCB fabrication to provide reduced solder void reduction for the solder between an electronic package and a thermal pad of the PCB as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
fabricating a printed circuit board, wherein the fabricating comprises, forming at least one conductive layer on top a first dielectric layer;
forming a second dielectric layer on top of the at least one conductive layer;
forming a thermal pad on top of the second dielectric layer, wherein an electronic package is to be soldered on top of the thermal pad;
forming a first through hole through the thermal pad, the second dielectric layer, the at least one conductive layer, and the first dielectric layer;
filling the first through hole with a conductive material to form a plated through hole for electrically coupling the thermal pad to the at least one conductive layer; and
topdrilling the plated through hole to remove a top portion of the conductive material from a top of the plated through hole, wherein a bottom portion of the conductive material remains in the plated through hole after removal of the top portion.

2. The method of claim 1, wherein the thermal pad comprises a copper pad.

3. The method of claim 1, further comprising soldering the electronic package on top of the thermal pad.

4. The method of claim 1, wherein the electronic package comprises a Quad Flat No-lead package.

5. The method of claim 1, further comprising:
forming a second through hole through the thermal pad, the second dielectric layer, the at least one conductive layer, and the first dielectric layer, wherein an interior wall of the second through hole is without a plating of conductive material after completion of fabricating of the printed circuit board.

6. The method of claim 5, wherein a diameter of the first through hole is greater than a diameter of the second through hole.

7. The method of claim 5, wherein use of the at least one conductive layer is independent of signaling during operation of the electronic package.

8. A method comprising:
fabricating a printed circuit board, wherein the fabricating comprises, forming a first conductive layer on top a first dielectric layer;
forming a second dielectric layer on top of the at least one first conductive layer;
forming a second conductive layer on top of the second dielectric layer; forming a third dielectric layer on top of the second conductive layer; forming a thermal pad on top of the third dielectric layer, wherein an electronic package is to be soldered on top of the thermal pad;
forming a first through hole through the thermal pad, the third dielectric layer, the second conductive layer, the second dielectric layer, the first conductive layer, and the first dielectric layer;
filling the first through hole with a conductive material to form a plated through hole; and
topdrilling the plated through hole to remove a top portion of the conductive material from a top of the plated through hole, wherein a bottom portion of the conductive material remains in the plated through hole after removal of the top portion.

9. The method of claim 8, wherein the thermal pad comprises a copper pad.

10. The method of claim 8, further comprising soldering the electronic package on top of the thermal pad.

11. The method of claim 8, wherein the electronic package comprises a Quad Flat No-lead package.

12. The method of claim 8, further comprising:
forming a second through hole through the thermal pad, the third dielectric layer, the second conductive layer, the second dielectric layer, the first conductive layer, and the first dielectric layer, wherein an interior wall of the second through hole is without a plating of conductive material after completion of fabricating of the printed circuit board.

13. The method of claim 12, wherein a diameter of the first through hole is greater than a diameter of the second through hole.

14. The method of claim 12, wherein use of the second conductive layer is independent of signaling during operation of the electronic package.

* * * * *